US012567606B2

(12) United States Patent
Brodbeck et al.

(10) Patent No.: US 12,567,606 B2
(45) Date of Patent: Mar. 3, 2026

(54) SYSTEMS, DEVICES, AND METHODS FOR A BATTERY SYSTEM

(71) Applicant: Caterpillar Inc., Peoria, IL (US)

(72) Inventors: Jared J. Brodbeck, Metamora, IL (US); Jason Lee Miller, Princeville, IL (US)

(73) Assignee: Caterpillar Inc., Peoria, IL (US)

( * ) Notice: Subject to any disclaimer, the term of this patent is extended or adjusted under 35 U.S.C. 154(b) by 860 days.

(21) Appl. No.: 17/663,578

(22) Filed: May 16, 2022

(65) Prior Publication Data

US 2023/0369658 A1 Nov. 16, 2023

(51) Int. Cl.
*H01M 10/42* (2006.01)
*B60L 58/10* (2019.01)
(Continued)

(52) U.S. Cl.
CPC ........... *H01M 10/425* (2013.01); *B60L 58/10* (2019.02); *G01K 3/005* (2013.01); *G01K 7/22* (2013.01);
(Continued)

(58) Field of Classification Search
CPC ............. H01M 10/425; H01M 10/482; H01M 10/486; H01M 50/519; H01M 50/522; H01M 2010/4271; H01M 2220/20; H01M 2200/105; H01M 10/637; H01M 50/284; H01M 50/502; H01M 50/204; B60L 58/10; B60L 2200/40; G01K 3/005; G01K 7/22; G01R 31/3835; G01R 31/396; H02J 7/00309; H02J 7/0031;

H02J 7/0047; H02K 11/0094; H02K 11/25; H05K 1/028; H05K 1/189; H05K 2201/10037; Y02E 60/10
See application file for complete search history.

(56) References Cited

U.S. PATENT DOCUMENTS 9,198,292 B2 11/2015 Kim et al.
10,720,626 B2 7/2020 Harris et al.
(Continued)

FOREIGN PATENT DOCUMENTS

CN 210723152 U 6/2020
CN 111816946 A 10/2020
(Continued)

OTHER PUBLICATIONS

Written Opinion and International Search Report for Int'l. Patent Appln. No. PCT/US2023/019557, mailed Aug. 17, 2023 (13 pgs).

*Primary Examiner* — Lisa S Park
(74) *Attorney, Agent, or Firm* — Bookoff McAndrews PLLC

(57) ABSTRACT

A battery system for a machine includes one or more battery module cell bus bars, one or more terminal bus bars, an interconnect system, and a battery module circuit. The one or more terminal bus bars include a coupling configured to couple the battery system to one or more components of the machine. The interconnect system couples the one or more battery module cells to the one or more terminal bus bars. The battery module circuit is coupled to one or more portions of the interconnect system. The battery module circuit includes one or more thermistors positioned at least partially overlapping with the one or more terminal bus bars.

20 Claims, 5 Drawing Sheets

(51) Int. Cl.

| | |
|---|---|
| *G01K 3/00* | (2006.01) |
| *G01K 7/22* | (2006.01) |
| *G01R 31/3835* | (2019.01) |
| *G01R 31/396* | (2019.01) |
| *H01M 10/48* | (2006.01) |
| *H01M 50/519* | (2021.01) |
| *H01M 50/522* | (2021.01) |
| *H02J 7/00* | (2006.01) |
| *H02K 11/00* | (2016.01) |
| *H02K 11/25* | (2016.01) |

(52) U.S. Cl.
CPC ....... *G01R 31/3835* (2019.01); *G01R 31/396* (2019.01); *H01M 10/482* (2013.01); *H01M 10/486* (2013.01); *H01M 50/519* (2021.01); *H01M 50/522* (2021.01); *H02J 7/00309* (2020.01); *H02J 7/0031* (2013.01); *H02J 7/0047* (2013.01); *H02K 11/0094* (2013.01); *H02K 11/25* (2016.01); *B60L 2200/40* (2013.01); *H01M 2010/4271* (2013.01); *H01M 2220/20* (2013.01)

(56) References Cited

U.S. PATENT DOCUMENTS

| | | | |
|---|---|---|---|
| 10,741,889 | B2 | 8/2020 | Newman et al. |
| 10,964,931 | B2 | 3/2021 | Coakley et al. |
| 2012/0161677 | A1* | 6/2012 | Kunimitsu .......... H01M 50/284 |
| | | | 320/134 |
| 2018/0062222 | A1* | 3/2018 | Koch ................ H01M 10/0525 |
| 2019/0288265 | A1* | 9/2019 | Jeon .................... H01M 50/209 |
| 2019/0296407 | A1* | 9/2019 | Newman ........... H01M 10/6555 |
| 2022/0077507 | A1 | 3/2022 | Hilligoss et al. |

FOREIGN PATENT DOCUMENTS

| | | | |
|---|---|---|---|
| EP | 3890055 | B1 | 10/2021 |
| WO | 2012011237 | A1 | 1/2012 |
| WO | 2012069111 | A3 | 5/2012 |
| WO | WO2018065853 | * | 4/2018 |

\* cited by examiner

SYSTEMS, DEVICES, AND METHODS FOR A BATTERY SYSTEM

TECHNICAL FIELD

The present disclosure relates generally to systems, devices, and methods for a battery system for use in industrial equipment, and, more particularly, to systems, devices, and methods for a battery system for use in an industrial vehicle or machine.

BACKGROUND

Electric or semi-electric vehicles, for example, wheel loaders, excavators, trucks (e.g., dump trucks, haul trucks, articulated dump trucks, etc.), track-type tractors (i.e., bull-dozers), graders, continuous miners, feeder breakers, roof bolters, utility vehicles for mining, load-haul-dump (LHD) vehicles, underground mining loaders, underground articulated trucks, etc., include one or more batteries. The one or more batteries include various connections (i.e., electrical connections) in order to power one or more motors, heating and/or cooling systems, hydraulic system(s), navigation systems, lighting systems, electronics, auxiliary systems, etc. However, the one or more connections may fail, for example, due to damage, an improper connection, long-term use, etc., and the connection failures may cause damage to the the one or more batteries and/or to the machine, requiring repairs, replacement, or otherwise necessitating machine downtime.

U.S. Pat. No. 10,720,626, issued to Harris et al. on Jul. 21, 2020 ("the '626 patent"), describes systems and methods for positioning and managing battery cells in battery packs for electric vehicles. In particular, the '626 patent discloses a battery management system, and an interconnect assembly in communication with the battery management system. Additionally, the '626 patent discloses that the interconnect assembly includes one or more thermistors located in proximity to battery cells to sense the temperatures of the battery cells. Furthermore, the thermistors may be connected via a flexible printed circuit board to form a temperature sense ribbon. However, the thermistors of the '626 patent monitor the temperature of the battery cells, and not the battery terminals or bus bars. Furthermore, the systems of the '626 patent do not monitor temperatures to detect potential malfunctions of one or more connections, and do not initiate one or more warnings or other precautionary actions.

The systems, devices, and methods of the present disclosure may address or solve one or more of the problems set forth above and/or other problems in the art. The scope of the current disclosure, however, is defined by the attached claims, and not by the ability to solve any specific problem.

SUMMARY

This disclosure relates generally to the field of industrial vehicles. More specifically the present disclosure relates to systems, methods, and devices for monitoring and controlling a battery assembly for use with an industrial vehicle, such as a battery-powered, electric or semi-electric machine.

In some aspects, a battery system for a machine may include one or more battery module cell bus bars, one or more terminal bus bars, an interconnect system, and a battery module circuit. The one or more terminal bus bars may include a coupling configured to couple the battery system to one or more components of the machine. The interconnect system may couple the one or more battery module cells to the one or more terminal bus bars. The battery module circuit may be coupled to one or more portions of the interconnect system. The battery module circuit may include one or more thermistors positioned at least partially overlapping with the one or more terminal bus bars.

In some additional aspects, a battery management method may include initiating a machine operation for a machine. The machine may include a battery system, a battery management system coupled to the battery system, a motor powered by the battery system, and a user interface coupled to the battery management system. The battery system may include one or more battery module cell bus bars, one or more terminal bus bars, and a flexible circuit board including one or more thermistors. The one or more thermistors may at least partially overlap with the one or more terminal bus bars. The method may also include monitoring a temperature of the one or more terminal bus bars with the one or more thermistors, and, if the one or more thermistors detect a terminal bus bar temperature above a first threshold temperature, initiating a first warning or action. The first warning or action may include signaling the user interface to indicate a high battery temperature warning.

In further aspects, a machine may include one or more ground engaging elements, a battery system, a battery management system coupled to the battery system, a motor powered by the battery system and configured to drive the one or ground engaging elements, and a user interface coupled to the battery management system. The battery system may include one or more battery module cell bus bars, one or more terminal bus bars, and a flexible circuit board including one or more thermistors. The one or more thermistors may at least partially overlap with the one or more terminal bus bars. If the one or more thermistors detect a terminal bus bar temperature above a threshold temperature, the battery management system may be configured to derate the motor or disconnect the battery system from the motor.

DETAILED DESCRIPTION

Both the foregoing general description and the following detailed description are exemplary and explanatory only and are not restrictive of the features, as claimed. As used herein, the terms "comprises," "comprising," "having," "including," or other variations thereof, are intended to cover a non-exclusive inclusion, such that a process, method, article, or apparatus that comprises a list of elements does not include only those elements, but may include other elements not expressly listed or inherent to such a process, method, article, or apparatus. In addition, in this disclosure, relative terms, such as, for example, "about," "generally," "substantially," and "approximately" are used to indicate a possible variation of ±10% in the stated value.

Figure 1:
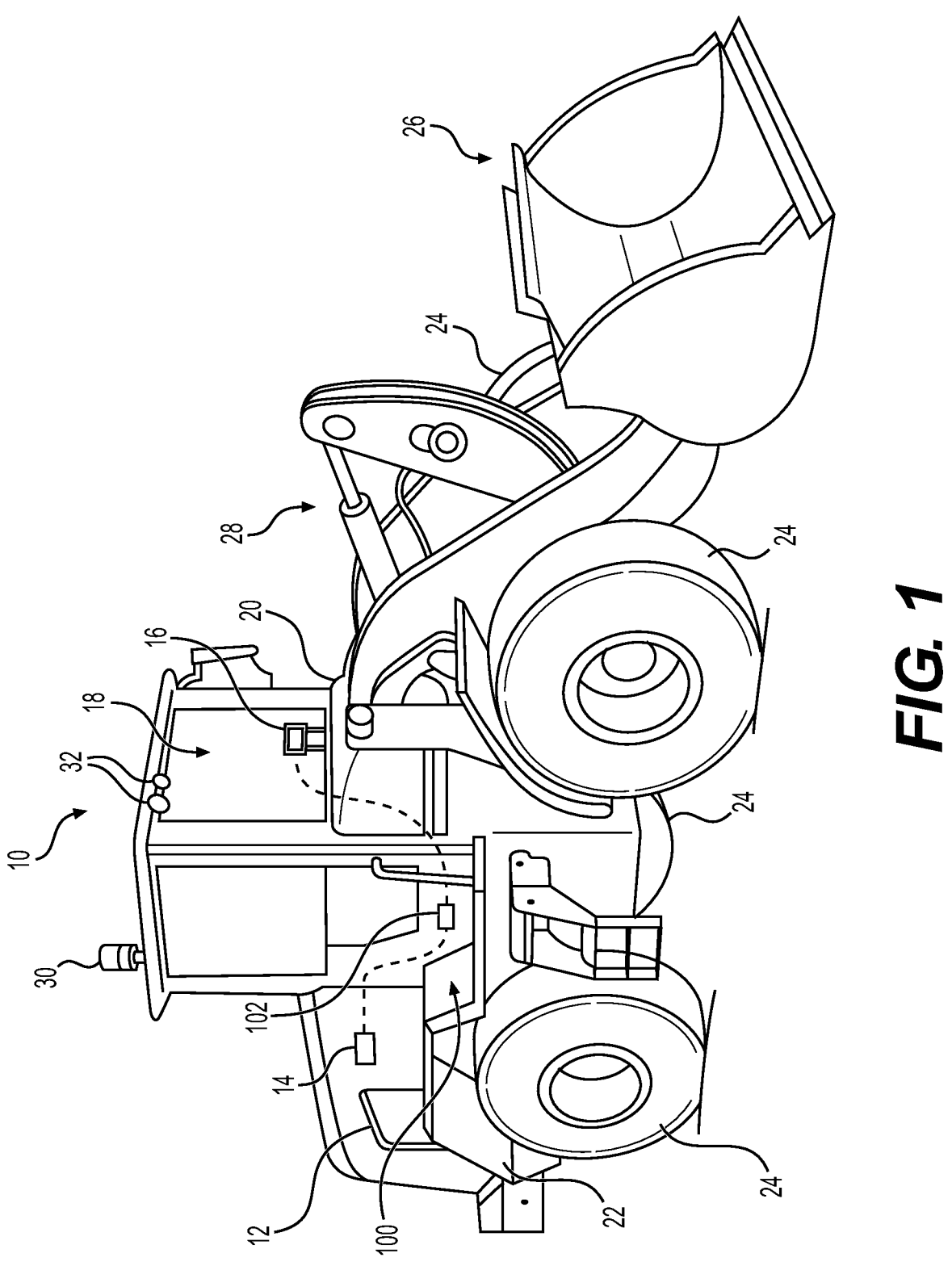
FIG. 1 is an illustration of an exemplary machine, including a control system, according to aspects of this disclosure.
Figure 2A:
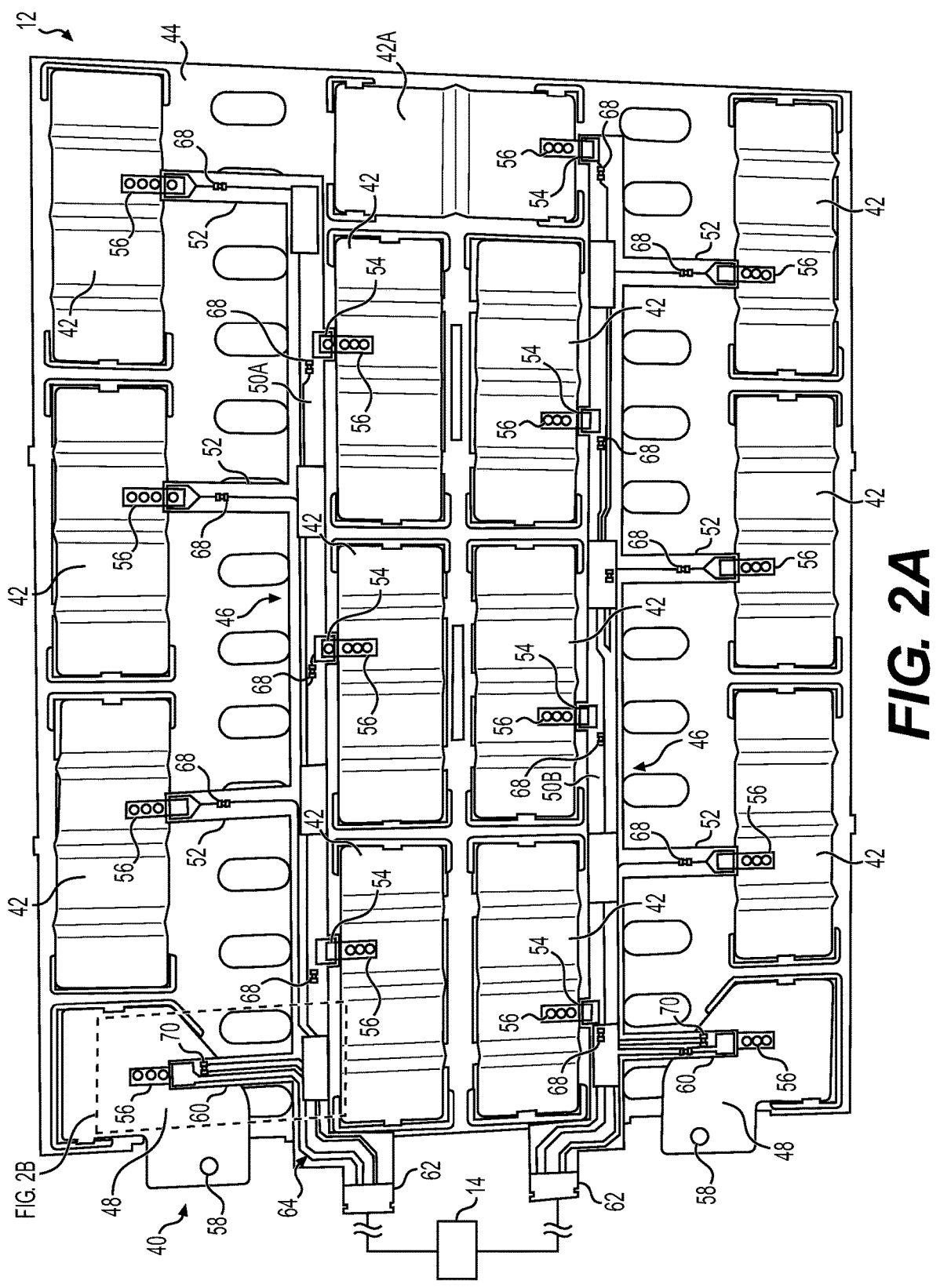
FIG. 2A shows a top view of an exemplary battery system with a battery management system.
Figure 2B:
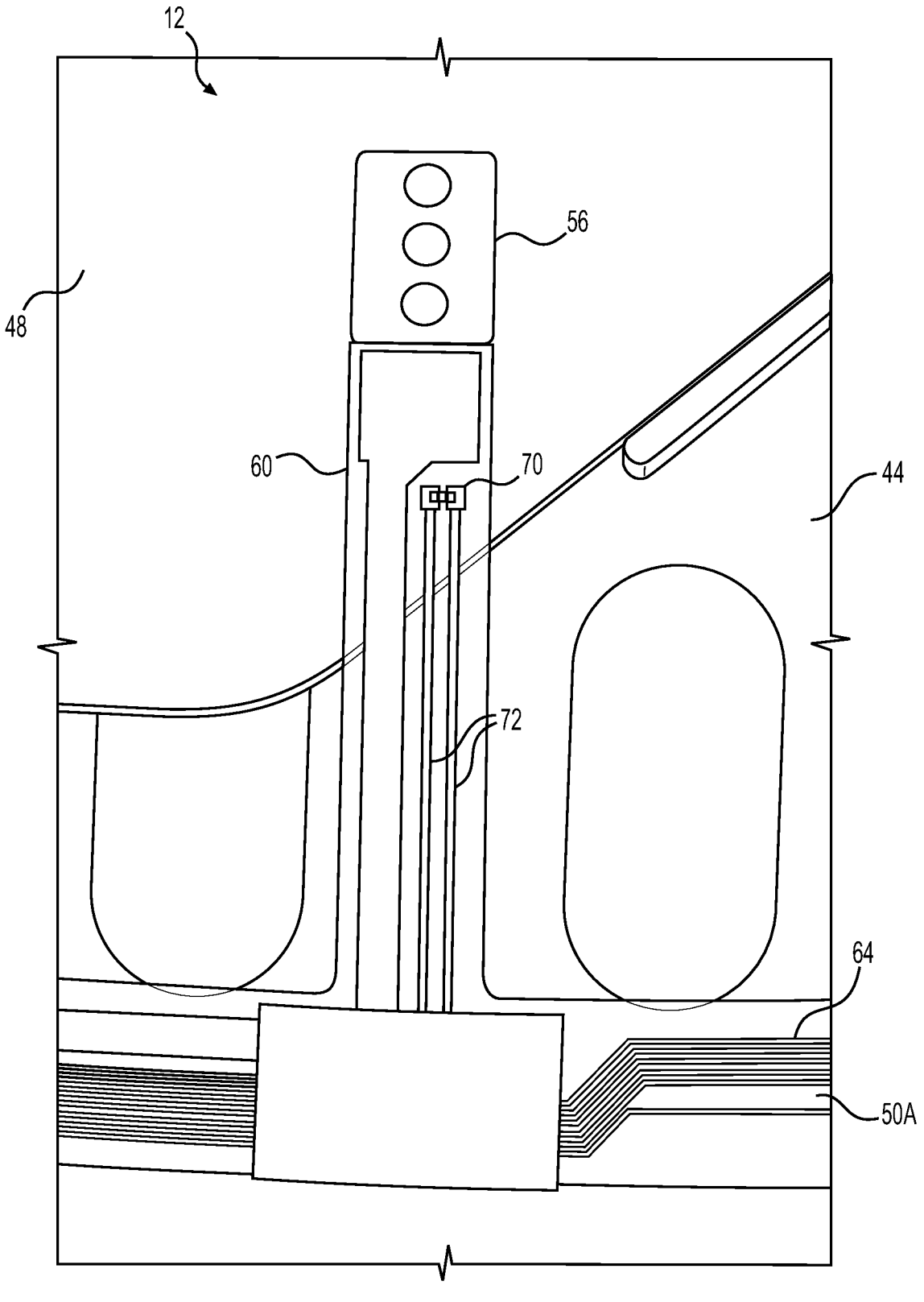
FIG. 2B is an enlarged view of a portion of FIG. 2A, according to aspects of this disclosure.
Figure 3:
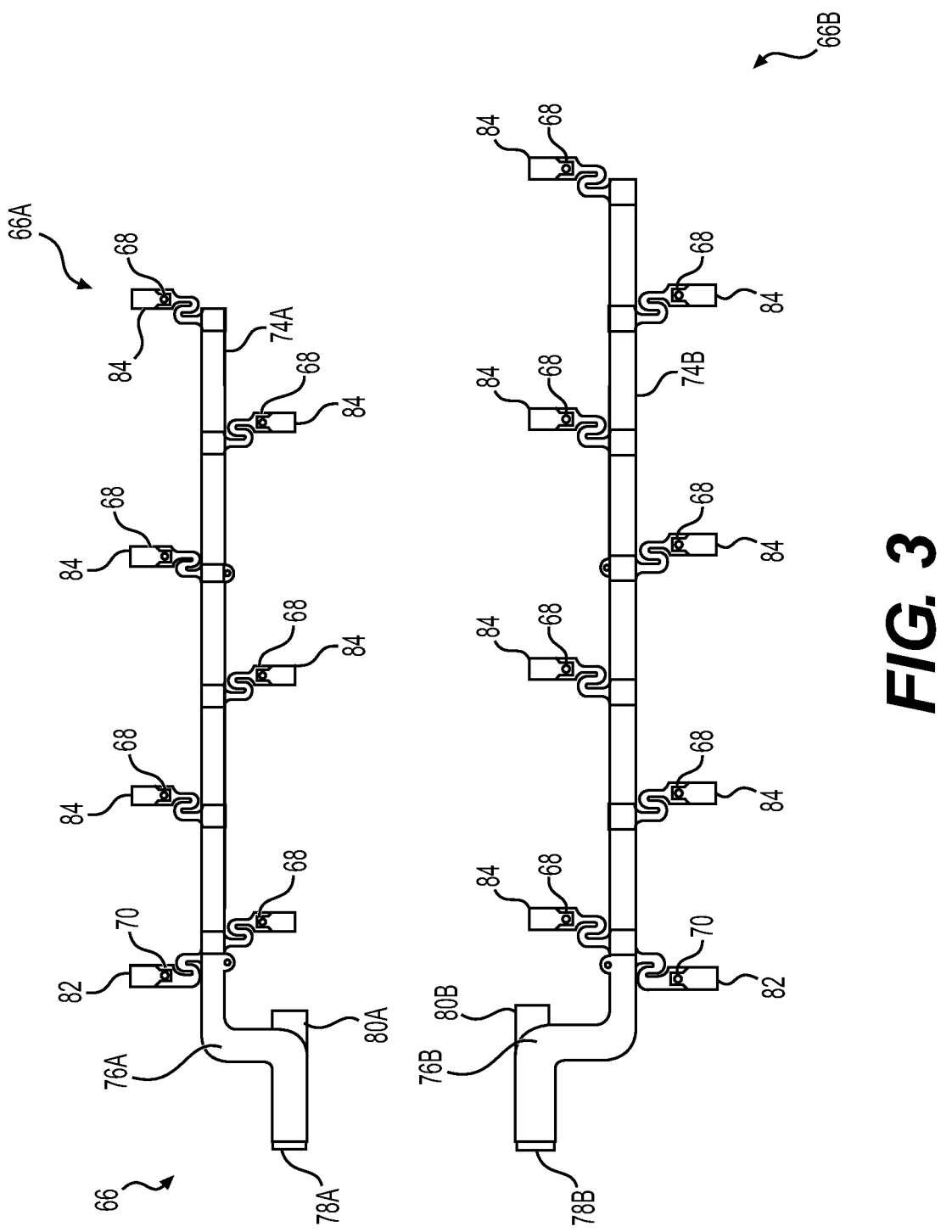
FIG. 3 shows a perspective view of a flexible or printed circuit board system for the battery system, according to an exemplary embodiment.

FIG. 1 illustrates a perspective view an exemplary vehicle or machine 10, which may be an electric vehicle or machine. As discussed in detail below, machine 10 includes a battery system 12, which includes one or more temperature sensors or thermistors (FIGS. 2A, 2B, and 3). Machine 10 may also include a battery management system 14, for example, in communication with one or more aspects or portions of battery system 12. Machine 10 also includes a controller 102, for example, coupled to or remote from machine 10. Machine 10 may include one or more user interfaces 16, for example, positioned in an operating station 18. Operating station 18 (e.g., a cab) may be positioned on machine 10, for example, in a central or forward portion of a machine frame 20, or may be remote from machine 10 (not shown). In these aspects, as shown in FIGS. 1 and 2A, one or more portions of each of battery system 12, battery management system 14, controller 102, and/or user interface(s) 16 may be in communication (e.g., via a wired or wireless connection), for example, to form a control system 100. In these aspects, and as discussed in detail below, when the temperature of one or more terminals or bus bars of battery system 12 is above one or more threshold temperatures, battery management system 14, controller 102, and/or user interface 16 may initiate one or more warnings and/or one or more steps or precautionary actions.

As shown in FIG. 1, battery system 12 may be positioned in a rear portion of machine 10. Alternatively, battery system 12 may be positioned anywhere on machine 10. Additionally, in some aspects, battery system 12 may be removable, for example, to be charged away from machine 10, to be easily replaced with a charged battery system 12 to extend the work time of machine 10, reduce downtime for charging, etc.

Battery system 12 may power a motor 22 and/or other components of machine 10. Machine 10 may include one or more ground engaging elements, for example, wheels 24, which may be driven by motor 22. In another aspect, machine 10 may instead have tracks (not shown). In one aspect, machine 10 may be fully electric, for example, with machine 10 being fully powered by battery system 12. Although not shown, machine 10 may be semi-electric (i.e., hybrid) and may include an engine, for example, to help drive wheels 24 and/or power one or more additional components of machine 10. Furthermore, although not shown, machine 10 may include one or more unit controllers (i.e., a motor controller, an engine controller, etc.), which may be incorporated in controller 102 or be separate but communicably connected to controller 102.

Controller 102 may be in communication with one or more features or portions of machine 10. Controller 102 may receive inputs and send outputs, for example, in order to operate machine 10, including initiating one or more indications or warnings on user interface 16, derating one or more components of machine 10, and/or stopping or shutting down one or more components of machine 10 or the entirety of machine 10. Although not shown, controller 102 may be coupled to or include one or more memory units, which may contain instructions for controller 102 to initiate one or more displays or one or more precautionary steps or procedures. Controller 102 may be a separate controller on machine 10, or may be integrated into a central vehicle controller (e.g., a main power or operation controller, etc.). Alternatively, controller 102 may be integrated into one or more of battery management system 12, a motor control module, or another dedicated control module on machine 10. In one aspect, machine 10 may be an electrohydraulic wheel loader, and controller 102 may control one or more electrical switches or valves in order to control one or more hydraulic cylinders or electrical elements in order to operate machine 10.

Controller 102 may embody a single microprocessor or multiple microprocessors that may include systems for performing any of the operations mentioned herein. For example, controller 102 may include a memory, a secondary storage device, a processor, such as a central processing unit or any other systems for accomplishing a task consistent with the present disclosure. The memory or secondary storage device associated with controller 102 may be non-transitory computer-readable media that store data and/or software routines that may assist controller 102 in performing its functions, such as the functions of method or process 400 of FIG. 4, as discussed below. Further, the memory or secondary storage device associated with controller 102 may also store data received from the various inputs or sensors associated with machine 10. Numerous commercially available microprocessors can be configured to perform the functions of controller 102. It should be appreciated that controller 102 could readily embody a general machine controller capable of controlling numerous other machine functions. Various other known circuits may be associated with controller 102, including signal-conditioning circuitry, communication circuitry, hydraulic or other actuation circuitry, and other appropriate circuitry. As discussed herein, controller 102 may receive various inputs (e.g., from various sensors), and based on the various inputs, controller 102 may signal initiation of one or more indications or warnings (e.g., on user interface 16) and/or one or more precautionary steps or procedures.

Additionally, machine 10 may include one or more implements 26 (e.g., a bucket) coupled to and moveable relative to machine frame 20. As shown, machine 10 may be a wheel loader with a bucket as implement 26. The bucket may be coupled to and movable relative to machine frame 20 via one or more hydraulic systems 28, including one or more sets of rods and cylinders that may be operated by the movement and/or pressurization of hydraulic fluid via one or more pumps. Furthermore, machine 10 may include, be coupled to, and/or be in communication with one or more navigation systems 30 (e.g., a global positioning system, a total station system, a LIDAR system, a stringline sensor system, one or more proximity sensors, etc.). Machine 10 may also include one or more illumination systems 32, for example, one or more lights. As discussed in greater detail below, various aspects of machine 10 may be powered by battery system 12.

Although machine 10 is shown as a wheel loader including a bucket as implement 26, this disclosure is not so limited. For example, machine 10 may be an excavator with a bucket, a truck with a movable truck bed, a tractor with a blade, ripper, etc., a grader with a circle and grading blade, or any other vehicle or machine with or without a movable or positionable implement. Furthermore, in some examples, machine 10 may be a boat or marine application. In other aspects, machine 10 may be an energy storage machine, for example, a stationary energy storage device, or other energy storage application. In these aspects, battery system 12 and/or motor 22 may help propel the machine or vehicle, and also may help to control the movement and/or position of the respective implement(s) or other aspects of machine 10, for example, based on operator controls. In other aspects, battery system 12 may help power one or more other aspects of a machine, device, or application.

FIGS. 2A and 2B illustrate additional features of battery system 12. As mentioned, battery system 12 may be coupled to and power one or more aspects of machine 10. Battery system 12 may include a battery module 40, for example, including a plurality of battery packs or module cells coupled to (i.e., welded to) a plurality of module cell bus bars 42. Although not shown, a corresponding number of battery packs or module cells may be positioned adjacent to (i.e., below or into the page in FIG. 2A) to each of module cell bus bars 42. The plurality of module cell bus bars 42 may be coupled together and/or supported by a frame 44. As shown, in one aspect, battery module 40 may include twelve module cell bus bars 42. Nevertheless, it is noted that battery module 40 may include fewer or a greater number of module cells and module cell bus bars 42, and that the module cells and module cell bus bars 42 may be arranged in the parallel or mirrored arrangement (as shown) or in any other arrangement. Furthermore, module cells and module cell bus bars 42 may be substantially identical, or one or more of module cells and module cell bus bars 42 may be different sizes, powers, etc. Additionally, battery system 12 may include one or more crossover bus bars 42A, for example, as part of battery module 40. Crossover bus bar 42A may help control the operation of battery module 40, including module cell bus bars 42. For example, crossover bus bar 42A may help to electrically connect two or more module cell bus bars 42. In some aspects, crossover bus bar 42A may help to connect the plurality of module cell bus bars 42 in series.

Battery module 40 also includes an interconnect system 46 including or coupled to one or more terminal bus bars 48. Interconnect system 46 may connect each of module cell bus bars 42 to the one or more terminal bus bars 48. Interconnect system 46 may also connect crossover bus bar 42A to other components of battery module 40. For example, interconnect system 46 may include two interconnect rails 50A, 50B, and may include a plurality of arms 52. Battery module 40 may include two terminal bus bars 48, with each of interconnect rails 50A, 50B connecting module cell bus bars 42 to one of the two terminal bus bars 48. Arms 52 may extend from interconnect rails 50A, 50B, for example, at substantially right angles, in order to connect interconnect rails 50A, 50B to a respective module cell bus bar 42. Additionally, interconnect rails 50A, 50B may also be positioned adjacent to or in proximity to one or more module cell bus bars 42, in which case, one or more extensions 54 may extend from interconnect rails 50A, 50B, for example, at substantially right angles, in order connect interconnect rails 50A, 50B to a respective battery module 40. As shown in FIG. 2A, extensions 54 may be shorter than arms 52. Alternatively, in some aspects, extensions 54 may be same or similar length as arms 52, for example, extending underneath or below respective module cell bus bars 42. In these aspects, arms 52 and/or extensions 54 may be coupled to respective module cell bus bars 42 via a coupling element 56, for example, including one or more welds, solders, bolts, or other appropriate connection(s).

As shown, battery module 40 may include two terminal bus bars 48, and terminal bus bars 48 (along with interconnect system 46) may be configured to route electrical power from and/or to one or more module cell bus bars 42. For example, terminal bus bars 48 may each include one or more couplings, ports, or openings 58 configured to receive connection elements, and thus route electrical power to or from one or more module cell bus bars 42. Interconnect system 46 may include one or more bus bar arms 60 to couple (i.e., electrically connect) interconnect rails 50A, 50B to terminal bus bars 48, for example, via one or more additional coupling elements 56. Furthermore, interconnect system 46 may include one or more other coupling elements 56, for example, positioned on or adjacent to arms 52 and/or extensions 54, to electrically couple each battery module 40 to interconnect system 46, and thus to terminal bus bars 48. Additionally, interconnect system 46 may include one or more terminals 62, for example, to be electrically connect battery module 40 to one or more components of machine 10, for example, to battery management system 14. Various components or portions of interconnect system 46, including terminal bus bar(s) 48, interconnect rails 50A, 50B, arms 52, extensions 54, coupling elements 56, bus bar arm 60, terminals 62, etc., may be formed of a metallic material (e.g., aluminum).

Furthermore, battery module 40 includes a battery module circuit 64, for example, including a printed or flexible circuit board system 66 (FIG. 3). As shown in FIG. 2A, battery module circuit 64 may include a plurality of voltmeters 68, for example, to be positioned on or adjacent to each module cell bus bar 42. Voltmeters 68 may help to measure and/or detect electricity flowing from and/or power remaining in each module cell via each battery module cell bus bar 42. Voltmeters 68 may be positioned on battery module circuit 64 such that each voltmeter 68 is positioned on a respective arm 52, or, alternatively, on a portion of a respective interconnect rail 50A, 50B adjacent a respective extension 54.

Moreover, as shown in greater detail in FIGS. 2B and 3, one or more thermistors 70 may be positioned on or adjacent to one or more portions of battery module 40, for example, via flexible circuit board system 66. For example, as shown in FIGS. 2A and 2B, thermistor(s) 70 may be coupled to battery module circuit 64, for example, with battery module circuit 64 being on or including flexible circuit board system 66 (FIG. 3). Thermistor 70 may be positioned on or adjacent to one or more terminal bus bars 48, for example, in proximity to opening 58 of one or more terminal bus bars 48. In one aspect, one thermistor 70 is positioned on or adjacent to each of terminal bus bars 48. Alternatively, one thermistor 70 may be positioned on or adjacent to only one terminal bus bar 48. In these examples, thermistor 70 may be positioned on portions of flexible circuit board system 66 such that thermistor 70 may be positioned on a portion of bus bar arm 60 that overlaps with a portion of terminal bus bar 48. For example, thermistor 70 may be positioned approximately 50% along a length of bus bar arm 60, approximately 60% of the length of bus bar arm 60, approximately 70% of the length of bus bar arm 60, approximately 80% of the length of bus bar arm 60, approximately 90% of the length of bus bar arm 60, etc. Additionally, as mentioned, each thermistor 70 is a part of flexible circuit board system 66. For example, each thermistor 70 may include one or more connection wires 72 that may be incorporated in respective portions of flexible circuit board system 66.

As mentioned above and as shown in FIG. 2A, battery management system 14 may be coupled to battery system 12, for example, via one or more connections of battery module circuit 64, for example, via one or more connections of flexible circuit board 66. For example, battery management system 14 may be coupled to one or more of terminals 62. As discussed below in greater detail, battery management system 14 may initiate one or more warnings and/or one or more precautionary steps or procedures based on one or more signals received from battery module circuit 64. For instance, battery management system 14 may receive signals from thermistor(s) 70 indicative of temperature(s) on or adjacent to one or more terminal bus bars 48. In this aspect, an increased temperature on or adjacent to one or more terminal bus bars 48 may be indicative of one or more potential issues or failures (i.e., connection failures, improper connections, etc.) or other potentially dangerous conditions. For example, if thermistor 70 signals a temperature above a certain temperature, battery management system 14 may initiate one or more warnings and/or precautions. In these aspects, battery management system 14 may signal for different warnings and/or precautions to be taken depending on the temperature measured by thermistor 70. For example, if thermistor 70 detects a first temperature, then battery management system 14 may signal user interface 16 to indicate a high battery temperature warning. Then, if thermistor 70 detects a second temperature higher than the first temperature, then battery management system 14 may signal motor 22 or an engine (not shown) to derate. Furthermore, if thermistor 70 detects a third temperature higher than the second temperature, then battery management system 14 may signal motor 22, an engine, other components of machine 10, or the entirety of machine 10 to shut down and stop operating. Alternatively or additionally, if thermistor 70 detects one or more temperatures (i.e., one or more of the first temperature, the second temperature, the third temperature, or a different temperature), then battery management system 14 may disconnect one or more portions of battery system 12 (i.e., battery module 40) from one or more other portions of machine 10 (i.e., motor 22), for example in addition to or instead of derating motor 22.

FIG. 3 illustrates aspects of flexible circuit board system 66 separate from other aspects of battery system 12, for example, separate from module cell bus bars 42, frame 44, and interconnect system 46 (FIG. 2A). Flexible circuit board system 66 may include two flexible circuit boards 66A, 66B, which may be couplable to respective portions of battery system 12. For example, flexible circuit boards 66A, 66B may be substantially mirror images of each other. Each flexible circuit board 66A, 66B may include a longitudinal portions 74A, 74B, for example, to at least partially overlap with interconnect rails 50A, 50B of interconnect system 46 (FIG. 2A). Longitudinal portions 74A, 74B may include one or more bent portions 76A, 76B, for example, connecting longitudinal portions 74A, 74B to terminal portions 78A, 78B. Additionally, one or more stiffeners 80A, 80B may be coupled to one or more portions of flexible circuit board 66A, 66B, for example, to help couple flexible circuit board 66A, 66B to terminal portions 78A, 78B. As discussed above, terminal portions 78A, 78B may at least partially overlap with terminals 62, for example, to connect flexible circuit boards 66A, 66B to battery management system 14 (FIG. 2A).

Additionally, flexible circuit boards 66A, 66B may each include a plurality of circuit arms, for example, a first circuit arm 82 and a plurality of second circuit arms 84, for example, to be coupled to respective arms 52 and/or extensions 54 of interconnect rails. For example, circuit arms 82 may include one or more thermistors 70. Circuit arms 82 may at least partially overlap with terminal bus bars 48, such that thermistors 70 may monitor the temperature of terminal bus bars 48, as discussed above. Additionally, circuit arms 84 may include one or more voltmeters 68, for example, to be positioned on or adjacent to each module cell bus bar 42 and/or crossover bus bar 42A and measure and/or detect electricity flowing from and/or power remaining in each module cell bus bar 42 and/or crossover bus bar 42A. In one aspect, flexible circuit board 66A may include one first circuit arm 82 and six second circuit arms 84. Furthermore, in one aspect, flexible circuit board 66B may include one first circuit arm 82 and seven second circuit arms 84. For both flexible circuit boards 66A, 66B, second circuit arms 84 may extend from alternating sides of longitudinal portions 74A, 74B.

It is noted that the number and/or arrangement of circuit arms 82, 84 on respective flexible circuit boards 66A, 66B may vary, for example, depending on the number and/or arrangement of module cell bus bars 42, terminal bus bars 48, interconnect rails 50A, 50B, arms 52, extensions 54, and/or other portions of battery system 12. In these aspects, first circuit arms 82 may be positioned to at least partially overlap with terminal bus bars 48, for example, to measure and/or detect the temperature of terminal bus bars 48, and second circuit arms 84 may be positioned to be adjacent to or in proximity to module cell bus bars 42 and/or crossover bus bar 42A, as discussed above.

Figure 4:
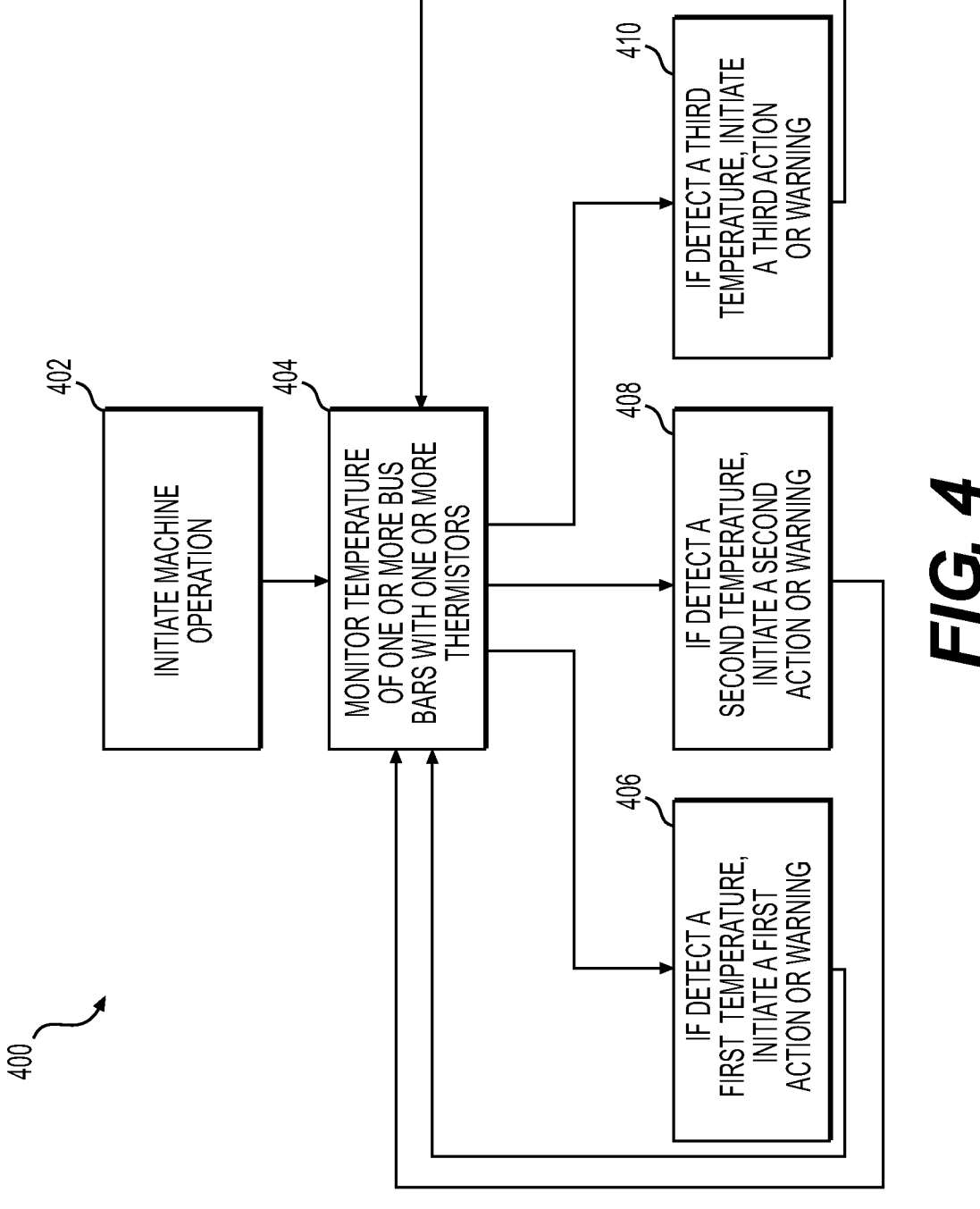
FIG. 4 is a flowchart depicting an exemplary method for monitoring the temperature of one or more portions of the battery system and initiating one or more warnings or other precautionary actions, according to aspects of this disclosure.

FIG. 4 is a flow diagram portraying an exemplary method 400 that may be performed by control system 100 (e.g., by one or more of battery management system 14, user interface 16, and/or controller 104) to automatically monitor and/or control one or more aspects or portions of machine 10. For example, when machine 10 is an operating mode, control system 100 may monitor the temperature of one or more terminal bus bars 48. Additionally, control system 100 may signal one or more warnings or initiate one or more precautionary procedures or actions if the temperature exceeds one or more threshold temperatures. The one or more warnings and/or precautionary procedures or actions may include indicating of an improper or potentially faulty connection to the one or more terminal bus bars 48, derating one or more components of machine 10, or shutting down or stopping one or more components of machine 10.

Method 400 includes an initial step 402, which includes initiating a machine operation. For example, step 402 may include powering up or otherwise starting machine 10 and operating machine 10. Operating machine 10 may include powering motor 22, manipulating implement 26, and/or activating one or more of hydraulic system 28, navigation system 30, illumination system 32, control system 100, or other aspects of machine 10. Step 402 may include an operation action, for example, starting machine 10 and/or directing machine 10 to perform an operation (e.g., an earth moving operation).

Next, method 400 includes a step 404, which includes monitoring the temperature of one or more terminal bus bars 48 with one or more thermistors 70. As discussed above, thermistor(s) 70 are positioned on flexible circuit board 66 and may be a part of battery module circuit 64. Furthermore, thermistor(s) 70 are positioned on or adjacent to each of terminal bus bars 48, for example, in proximity to openings 58 on terminal bus bars 48. As mentioned and as detailed below, an increased temperature of terminal bus bar(s) 48 may be indicative of one or more potential issues or failures (i.e., connection failures) or other potentially dangerous conditions.

Method 400 also includes one or more of steps 406, 408, or 410. For example, if thermistor(s) 70 detect a first temperature (e.g., a first threshold temperature), step 406 includes initiating a first action or warning. For example, the first action or warning may include signaling user interface 16 to indicate a high battery temperature warning, for example, including a blinking light or icon, a buzzer or other sound, etc.

If thermistor(s) 70 detect a second temperature (e.g., a second threshold temperature higher than the first threshold temperature), step 408 includes initiating a second action or warning. In some aspects, the second action or warning may also include the first action or warning. The second action or warning may include signaling motor 22, an engine (not shown), or one or more other components of machine 10 to derate or otherwise reduce operating power or capacity.

If thermistor(s) 70 detect a third temperature (e.g., a third threshold temperature higher than the second threshold temperature), step 410 includes initiating a third action or warning. In some aspects, the third action or warning may also include one or more of the first action or warning or the second action or warning. The third action or warning may include signaling motor 22, an engine (not shown), other components of machine 10, or the entirety of machine 10 to shut down and stop operating.

Although not shown, method 400 may also include one or more other actions or warnings. For example, method 400 may include initiating a display of a warning on an additional user interface, for example, a user interface in a control station or otherwise remote from machine 10. Alternatively or additionally, method 400 may include modifying the operation parameters of one or more other components or systems of machine 10, for example, raising implement 26 to be unengaged with a ground surface, pausing or shutting down one or more of hydraulic system 28, navigation system 30, illumination system 32, or other systems or components of machine 10.

INDUSTRIAL APPLICABILITY

Machine 10 and control system 100, including battery system 12, battery management system 14, user interface 16, and controller 102, may help to monitor the connection(s) to one or more terminal bus bars 48. For example, one or more thermistors 70 may be positioned on or near terminal bus bars 48. One or more thermistors 70 may be positioned in proximity to one or more openings 58, for example, where terminal bus bars 48 are electrically coupled to one or more connection elements to route electrical power to or from one or more module cell bus bars 42 and/or crossover bus bar 42A (e.g., via interconnect system 46). As such, thermistors 70 may help to monitor the temperature of terminal bus bars 48. Moreover, control system 100, including battery system 12, battery management system 14, user interface 16, and controller 102, may help to initiate one or more warnings or precautionary procedures or actions. The one or more warnings or precautionary procedures or actions may help to warn the operator(s) and/or help prevent damage to battery system 12 and/or other components of machine 10 that can be caused by faulty or damages battery connections.

As discussed above, terminals 62 may be communicably coupled to battery management system 14. In this aspect, control system 100, including battery system 12, battery management system 14, user interface 16, and controller 102, may monitor the temperature of terminal bus bars 48, and initiate one or more warnings or precautions in response to the detected temperatures, for example, because increases in the temperature of terminal bus bars 48 may be indicative of an improper connection or a potential connection failure. The one or more warnings or precautions may depend on the detected temperatures. For example, if one thermistor 70 detects a terminal bus bar temperature above a first threshold temperature, control system 100 may signal user interface 16 to indicate a high battery temperature warning, for example, including a blinking light or icon, a buzzer or other sound, etc. If one thermistor 70 detects a terminal bus bar temperature above a second threshold temperature, control system 100 may signal motor 22, an engine (not shown), or one or more other components of machine 10 to derate or otherwise reduce operating power or capacity. Furthermore, if one thermistor 70 detects a terminal bus bar temperature above a third threshold temperature, control system 100 may signal motor 22, an engine (not shown), other components of machine 10, or the entirety of machine 10 to shut down and stop operating. In these aspects, control system 100 may help to warn the operator of improper connections and/or of potential connection failures, and/or may help to prevent overheating of and/or damage to terminal bus bars 48 and/or other components of battery system 12 or machine 10.

Additionally, as discussed above, thermistor(s) 70 may be included on flexible circuit board 66. In this aspect, thermistor(s) 70 may be positioned on or near one or more terminal bus bars 48 when flexible circuit board 66 is positioned on various portions of interconnect system 46. One or more thermistors 70 may be coupled to connection wires 72, which may also be included on flexible circuit board 66. In this aspect, connection wires 72 may be a part of battery module circuit 64, and thus be connected to terminals 62. Furthermore, voltmeters 68 may help to monitor the power remaining in one or more battery module 40. Although not shown, battery module 40 may include one or more additional temperature sensors, for example, positioned on or adjacent to one or more module cell bus bars 42, crossover bus bar 42A, and/or on one or more portions of flexible circuit board 66, for example, to help detect temperature(s) of module cell bus bars 42, crossover bus bar 42A, portions of flexible circuit board 66, and/or other portions of battery module 40. For example, battery system 12, battery management system 14, user interface 16, controller 102, or other aspects of control system 100 may monitor temperatures of a plurality of portions of battery module 40, and may detect temperature differences between one or more portions of battery module 40. For example, one or more portions of control system 100 may initiate one or more warnings or precautions in response to the detected temperature differences. Alternatively or additionally, if thermistor 70 detects one or more temperatures (i.e., one or more of the first temperature, the second temperature, the third temperature, or a different temperature), then battery management system 14 may disconnect one or more portions of battery system 12 (i.e., battery module 40) from one or more other portions of machine 10 (i.e., motor 22), for example in addition to or instead of derating motor 22.

In these aspects, the first temperature threshold may correspond to a first temperature difference threshold, for example, approximately 5° C., between a temperature at one terminal bus bar 48 and a temperature at another location of battery module 40 (e.g., at one or more of battery module cell bus bars 42). Similarly, the second temperature threshold may correspond to a second temperature difference threshold, for example, approximately 10° C., between a temperature at one terminal bus bar 48 and a temperature at another location of battery module 40 (e.g., at one or more of battery module cell bus bars 42). Lastly, the third temperature threshold may correspond to a third temperature difference threshold, for example, approximately 15° C., between a temperature at one terminal bus bar 48 and a temperature at another location of battery module 40 (e.g., at one or more of battery module cell bus bars 42).

It will be apparent to those skilled in the art that various modifications and variations can be made to the disclosed systems, devices, and methods for a battery system without departing from the scope of the disclosure. Other embodiments of the systems, devices, and methods for a battery system will be apparent to those skilled in the art from consideration of the specification and the accompanying figures. It is intended that the specification, and, in particular, the examples provided herein be considered as exemplary only, with a true scope of the disclosure being indicated by the following claims and their equivalents.

What is claimed is:

1. A battery system for a machine, comprising:
one or more battery module cell bus bars;
one or more terminal bus bars, including a coupling configured to couple the battery system to one or more components of the machine;
an interconnect system including one or more interconnect bus bar arms coupling the one or more battery module cell bus bars to the one or more terminal bus bars, wherein a portion of one interconnect bus bar arm at least partially overlaps with one of the one or more terminal bus bars; and
a battery module circuit coupled to one or more portions of the interconnect system, wherein the battery module circuit includes one or more thermistors, wherein the one or more thermistors are positioned on the portion of one interconnect bus bar arm that at least partially overlaps with the one or more terminal bus bars.

2. The battery system of claim 1, further comprising a battery management system coupled to the battery module circuit and a controller, and wherein when the one or more thermistors measure a temperature over one or more threshold temperatures, one or more of the battery management system or the controller initiates one or more warnings or actions.

3. The battery system of claim 2, further comprising a user interface, and wherein when the one or more thermistors measure a temperature over a first threshold temperature, the battery management system signals the user interface to indicate a high battery temperature warning.

4. The battery system of claim 3, further comprising a motor, wherein when the one or more thermistors measure a temperature over a second threshold temperature higher than the first threshold temperature, the battery management system signals the motor to derate.

5. The battery system of claim 4, wherein when the one or more thermistors measure a temperature over a third threshold temperature higher than the second threshold temperature, the battery management system signals the motor to shut down or disconnects the battery system from one or more components of the machine.

6. The battery system of claim 1, wherein the one or more terminal bus bars includes first and second terminal bus bars, wherein a portion of a first bus bar arm at least partially overlaps with the first terminal bus bar, wherein a portion of a second bus bar arm at least partially overlaps with the second terminal bus bar, and wherein the one or more thermistors includes first and second thermistors, with the first thermistor positioned on the portion of the first bus bar arm that at least partially overlaps with the first terminal bus bar, and with the second thermistor positioned on the portion of the second bus bar arm that at least partially overlaps with the second terminal bus bar.

7. The battery system of claim 6, wherein the first and second thermistors are positioned on a flexible printed circuit board, and wherein the flexible printed circuit board further includes one or more voltmeters to detect power being delivered by the one or more battery module cell bus bars.

8. The battery system of claim 7, wherein the battery module circuit connects the first and second thermistors and the one or more voltmeters to a battery management system via one or more terminals, and wherein the battery system includes one or more stiffeners adjacent to the one or more terminals to couple the battery module circuit to the one or more terminals.

9. A battery management method, comprising:
initiating a machine operation for a machine, wherein the machine includes:
a battery system, wherein the battery system includes one or more battery module cell bus bars, one or more terminal bus bars, an interconnect system including one or more interconnect bus bar arms coupling the one or more battery module cell bus bars to the one or more terminal bus bars, and a flexible circuit board including one or more thermistors, wherein a portion of one interconnect bus bar arm at least partially overlaps with one of the one or more terminal bus bars, and wherein the one or more thermistors are positioned on the portion of the one interconnect bus bar arm that at least partially overlaps with the one or more terminal bus bars;
a battery management system coupled to the battery system;
a motor powered by the battery system; and
a user interface coupled to the battery management system;
monitoring a temperature of the one or more terminal bus bars with the one or more thermistors; and
when the one or more thermistors detect a terminal bus bar temperature above a first threshold temperature, initiating a first warning or action, wherein the first warning or action includes signaling the user interface to indicate a high battery temperature warning.

10. The method of claim 9, further comprising:
when the one or more thermistors detect a terminal bus bar temperature above a second threshold temperature higher than the first threshold temperature, initiating a second warning or action, wherein the second warning or action includes derating the motor.

11. The method of claim 10, wherein the second warning or action also includes signaling the user interface to indicate a high battery temperature warning.

12. The method of claim 10, further comprising:
when the one or more thermistors detect a terminal bus bar temperature above a third threshold temperature higher than the second threshold temperature, initiating a third warning or action, wherein the second warning or action includes shutting down the motor or disconnecting the battery system from the motor.

13. The method of claim 12, wherein the third warning or action also includes signaling the user interface to indicate a high battery temperature warning.

14. The method of claim 9, wherein the interconnect system includes one or more interconnect rails, and wherein the flexible circuit board is positioned at least partially overlapping with the one or more interconnect rails and the one or more interconnect bus bar arms.

15. A machine, comprising:
one or more ground engaging elements;
a battery system, wherein the battery system includes one or more battery module cell bus bars, one or more terminal bus bars, an interconnect system including one or more interconnect bus bar arms coupling the one or more battery module cell bus bars to the one or more terminal bus bars, and a flexible circuit board including one or more thermistors, wherein a portion of one interconnect bus bar arm at least partially overlaps with one of the one or more terminal bus bars, wherein the one or more thermistors are positioned on the portion of the interconnect bus bar arm that at least partially overlaps with the one or more terminal bus bars;

a battery management system coupled to the battery system;

a motor powered by the battery system and configured to drive the one or more ground engaging elements; and a user interface coupled to the battery management system, wherein when the one or more thermistors detect a terminal bus bar temperature above a threshold temperature, the battery management system is configured to derate the motor or disconnect the battery system from the motor.

16. The machine of claim 15, wherein the threshold temperature is a first threshold temperature, and wherein when the one or more thermistors detect a terminal bus bar temperature above a second threshold temperature higher than the first threshold temperature, the battery management system is configured to shut down the motor.

17. The machine of claim 15, wherein when the one or more thermistors detect a terminal bus bar temperature above the threshold temperature, the battery management system is also configured to signal the user interface to indicate a high battery temperature warning.

18. The machine of claim 15, wherein the interconnect system includes one or more interconnect rails, wherein the one or more interconnect bus bar arms connect each of the one or more battery module cell bus bars to the one or more interconnect rails, and wherein the flexible circuit board is positioned at least partially overlapping with the one or more interconnect rails and the one or more interconnect bus bar arms.

19. The machine of claim 18, wherein the interconnect system includes one or more terminal bus bar arms that connect the one or more interconnect rails to the one or more battery module cell bus bars, and wherein the one or more thermistors are positioned on one or more portions of the one or more terminal bus bar arms.

20. The machine of claim 15, wherein the one or more terminal bus bars are formed of aluminum.

* * * * *